United States Patent
Liu et al.

(10) Patent No.: US 8,653,664 B2
(45) Date of Patent: Feb. 18, 2014

(54) BARRIER LAYERS FOR COPPER INTERCONNECT

(75) Inventors: Nai-Wei Liu, Fengshan (TW); Zhen-Cheng Wu, Hsinchu (TW); Cheng-Lin Huang, Hsinchu (TW); Po-Hsiang Huang, Taipei (TW); Yung-Chih Wang, Taoyuan (TW); Shu-Hui Su, Tucheng (TW); Dian-Hau Chen, Hsinchu (TW); Yuh-Jier Mii, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 208 days.

(21) Appl. No.: 12/832,790

(22) Filed: Jul. 8, 2010

(65) Prior Publication Data

US 2011/0006429 A1 Jan. 13, 2011

Related U.S. Application Data

(60) Provisional application No. 61/223,884, filed on Jul. 8, 2009.

(51) Int. Cl.
*H01L 23/522* (2006.01)
*H01L 21/44* (2006.01)

(52) U.S. Cl.
USPC ........... 257/751; 257/753; 257/758; 257/760; 257/767; 257/774; 257/E21.49; 257/E21.57; 257/E21.58; 257/E23.01; 257/E23.16; 257/E23.161; 438/625; 438/639; 438/665; 438/687

(58) Field of Classification Search
USPC ................. 257/751, 753, 758, 760, 767, 774, 257/E21.48, E21.57, E21.58, E23.01, 257/E23.16, E23.161; 438/625, 639, 665, 438/687

See application file for complete search history.

(56) References Cited

U.S. PATENT DOCUMENTS

| | | | | |
|---|---|---|---|---|
| 5,904,565 A | * | 5/1999 | Nguyen et al. | 438/687 |
| 5,969,422 A | | 10/1999 | Ting et al. | |
| 6,836,017 B2 | * | 12/2004 | Ngo et al. | 257/751 |
| 7,026,238 B2 | * | 4/2006 | Xi et al. | 438/625 |
| 7,485,915 B2 | | 2/2009 | Nasu et al. | |
| 7,727,888 B2 | * | 6/2010 | Yang et al. | 438/665 |
| 8,072,075 B2 | * | 12/2011 | Jourdan et al. | 257/767 |
| 8,198,732 B2 | * | 6/2012 | Kageyama | 257/774 |
| 2007/0049024 A1 | | 3/2007 | Nakao et al. | |
| 2007/0148944 A1 | | 6/2007 | Lee | |

(Continued)

OTHER PUBLICATIONS

Kudo, H. et al., "Further Enhancement of Electro-Migration Resistance by Combination of Self-Aligned Barrier and Copper Wiring Encapsulation Techniques for 32-nm Nodes and Beyond", IEEE 2008, pp. 117-119.

(Continued)

*Primary Examiner* — Dao H Nguyen
(74) *Attorney, Agent, or Firm* — Lowe Hauptman & Ham, LLP

(57) ABSTRACT

A copper interconnect includes a copper layer formed in a dielectric layer, having a first portion and a second portion. A first barrier layer is formed between the first portion of the copper layer and the dielectric layer. A second barrier layer is formed at the boundary between the second portion of the copper layer and the dielectric layer. The first barrier layer is a dielectric layer, and the second barrier layer is a metal oxide layer.

20 Claims, 4 Drawing Sheets

(56) References Cited

U.S. PATENT DOCUMENTS

| | | | |
|---|---|---|---|
| 2008/0054467 A1* | 3/2008 | Ohba et al. | 257/751 |
| 2008/0142974 A1 | 6/2008 | Arakawa | |
| 2008/0173547 A1 | 7/2008 | Ohba et al. | |
| 2008/0179747 A1 | 7/2008 | Sakai et al. | |
| 2008/0213998 A1 | 9/2008 | Nagai et al. | |
| 2008/0230375 A1 | 9/2008 | Maekawa et al. | |
| 2009/0206485 A1* | 8/2009 | Yang et al. | 257/751 |
| 2010/0320604 A1* | 12/2010 | Isobayashi | 257/751 |
| 2011/0006429 A1 | 1/2011 | Liu et al. | |
| 2011/0049718 A1 | 3/2011 | Matsumoto et al. | |
| 2011/0100697 A1 | 5/2011 | Yang et al. | |
| 2011/0233780 A1 | 9/2011 | Gordon et al. | |

OTHER PUBLICATIONS

Kudo, H. et al., "Copper Wiring Encapsulation with Ultra-Thin Barriers to Enhance Wiring and Dielectric Reliabilities for 32-nm Nodes and Beyond", IEEE 2007, pp. 513-516.

Usui, T., et al., "High Performance Ultra Low-k (k=2.0keff-2.4)/Cu Dual-Damascene Interconnect Technology with Self-Formed MnSixOy Barrier for 32 nm-node", IEEE 2006, pp. 216-218.

Iijima, J., et al, "Growth Behavior of Self-Formed Barrier Using Cu—Mn Alloys at 350 to 600 C", IEEE 2006, pp. 155-157.

Ohoka, Y., et al., "Integration of High Performance and Low Cost Cu/Ultra Low-k SiOC (k=2.0) Interconnection with Self-Formed Barrier Technology for 32nm-node and Beyond", IEEE 2007, pp. 67-69.

\* cited by examiner

BARRIER LAYERS FOR COPPER INTERCONNECT

CROSS-REFERENCE TO RELATED APPLICATIONS

The present application claims priority of U.S. Provisional Patent Application Ser. No. 61/223,884, filed on Jul. 8, 2009, which is incorporated herein by reference in its entirety.

TECHNICAL FIELD

The present invention relates to semiconductor devices, and particularly to copper interconnects and methods for their fabrication.

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller.

A move is being made away from the traditional materials used in the past in semiconductor device designs, in order to meet these demands. To reduce the RC time delay, low dielectric constant (low-k) materials are being used as insulating materials, and there is a switch being made to the use of copper for interconnect materials, rather than aluminum. Advantages of using copper for semiconductor device interconnects include abilities to operate faster and to manufacture thinner conductive lines, because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which includes forming openings by patterning and etching inter-metal dielectric (IMD) layers and filling the openings with copper. Because copper diffuses easily into some dielectric materials, especially some types of low-k dielectric materials, a diffusion barrier layer is usually deposited on the inner walls of the damascene opening before the copper is formed. Refractory metals such as tantalum (Ta) or titanium (Ti), or nitride compounds of these metals are used as materials of the diffusion barrier film. However, there are some challenges in using refractory metals in the copper damascene structure, because these metallic films have high resistance, thereby causing increased resistance in the copper lines and increased RC delay, especially in small, narrow features.

As the shrinkage of copper wires has progressed in recent years, there is a trend towards thinner films being used for the diffusion barrier film. A physical vapor deposition (PVD) process used for depositing a thinner TaN/Ta barrier layer encounters difficulties in advanced scale of interconnection. An atom layer deposition (ALD) process is the candidate to deposit a very thin diffusion barrier layer with uniform coverage, but the ALD method is disadvantageous because of extremely low deposition rate and poor throughput. In addition, in manufacturing the TaN/Ta film, a problem occurs in which favorable adhesion between the diffusion barrier layer and the IMD layer cannot be achieved. For example, copper wires peel off at the interface, worsening the yield of the semiconductor device.

Therefore, there is a need for improved diffusion barrier layers in the copper interconnect, and methods of forming thereof.

BRIEF DESCRIPTION OF THE DRAWINGS

The objects, features and advantages of these embodiments will become apparent by referring to the following detailed description with reference to the accompanying drawings, wherein.

DETAILED DESCRIPTION

Figure 1:
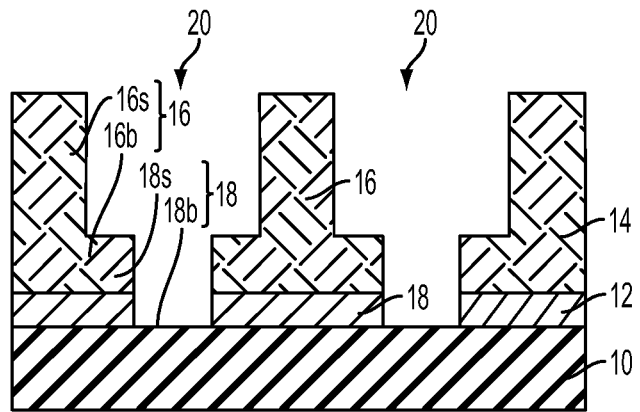
FIG. 1 to FIG. 6 are cross-sectional diagrams illustrating an exemplary embodiment of a copper interconnect process.

Embodiments provide barrier layers formed in a copper interconnect structure of a semiconductor device and methods of forming thereof, which has wide applicability to many manufacturers, factories and industries, including integrated circuit fabrications, microelectronic fabrications, and optical electronic fabrications. Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present invention. It is to be understood that elements not specifically shown or described may take various forms. Further, when a layer is referred to as being on another layer or "on" a substrate, it may be directly on the other layer or on the substrate, or intervening layers may also be present.

Herein, cross-sectional diagrams of FIG. 1 to FIG. 6 illustrate an exemplary embodiment of a copper interconnect process.

With reference now to FIG. 1, a semiconductor substrate 10 is provided with a stacked dielectric structure including an etch stop layer 12 and an inter-metal dielectric (IMD) layer 14 formed thereon, and openings 20 formed in the stacked dielectric structure. The semiconductor substrate 10 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and/or passive semiconductor devices. A conductive region formed in and/or on the semiconductor substrate 10 is a portion of conductive routes and has exposed surfaces that may be treated by a planarization process, such as chemical mechanical polishing. Suitable materials for the conductive regions may include, but are not limited to, for example copper, aluminum, copper alloy, or other mobile conductive materials. A copper interconnect level may be the first or any subsequent metal interconnect level of the semiconductor device.

The etch stop layer 12 for controlling the end point during subsequent etching processes is deposited on the above-described semiconductor substrate 10. The etch stop layer 12 may be formed of silicon oxide, silicon nitride, silicon carbide, silicon oxynitride or combinations thereof, with a thickness of about 10 angstroms to about 1000 angstroms, which may be formed through any of a variety of deposition techniques, including LPCVD (low-pressure chemical vapor deposition), APCVD (atmospheric-pressure chemical vapor deposition), PECVD (plasma-enhanced chemical vapor deposition), PVD (physical vapor deposition), sputtering, or other deposition procedures.

The IMD layer 14 may be a single layer or a multi-layered structure. The thickness of the IMD layer 14 varies with the applied technology, for example a thickness of about 1000 angstroms to about 30000 angstroms. In an embodiment, the IMD layer 14 is an oxygen-containing dielectric layer. The IMD layer 14 may be formed of $SiO_2$, carbon-doped $SiO_2$, a comparatively low dielectric constant (k value) dielectric material with a k value less than about 4.0, or combinations thereof. The IMD layer 14 may be formed of a low-k dielectric material, an extreme low-k dielectric material, a porous low-k dielectric layer, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymers, organic silica glass, FSG (SiOF series materials), HSQ (hydrogen silsesquioxane) series materials, MSQ (methyl silsesquioxane) series materials, or porous organic series materials. The IMD layer 14 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating, or another process that is adapted to form a thin film layer over the substrate.

The opening 20 is an exemplary dual damascene opening 20 including an upper trench section 16 and a lower via-hole section 18 patterned in the IMD layer 14 to define a contact region on the semiconductor substrate 10. Although the embodiments illustrate dual damascene openings in the IMD layer 14, the use of single damascene openings in the IMD layer also provide values. In dual damascene techniques including a "via-first" patterning method or a "trench-first" patterning method, the upper trench section 16 and the lower via-hole section 18 may be formed using a lithographic process with masking technologies and anisotropic etch operation (e.g., plasma etching or reactive ion etching). A bottom etch stop layer, a middle etch stop layer, a polish stop layer, or an anti-reflective coating (ARC) layer may be optionally deposited on or intermediately in the IMD layer 14, providing a clear indicator of when to end a particular etching process. The upper trench section 16 includes sidewall portions 16s and a bottom portion 16b. The lower via-hole section 18 includes sidewall portions 18s and a bottom portion 18b. The bottom portion 16b is adjacent to the sidewall portion 16s and the sidewall portion 18s. The bottom portion 18b exposes a portion of the semiconductor substrate 10.

Figure 2:
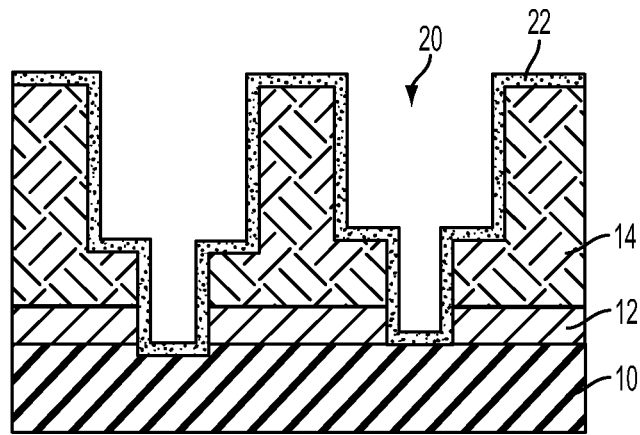

Referring to FIG. 2, a first barrier layer 22 is deposited on the above-described substrate 10 to line the sidewalls and bottoms of the dual damascene openings 20. In detail, the first barrier layer 22 lines the sidewall portions 16s and bottom portions 16b of the upper trench section 16, and lines the sidewall portions 18s and bottom portions 18b of the lower via-hole section 18. In an embodiment, the first barrier layer 22 is an oxygen-containing dielectric layer. The oxygen-containing dielectric layer may include silicon oxycarbide (SiCO), tetraethyl orthosilicate (TEOS), silicon oxide ($SiO_2$), or the like, which may be deposited by using e.g., chemical vapor deposition (CVD), plasma enhanced CVD (PECVD), low pressure CVD (LPCVD), or other deposition techniques.

Figure 3:
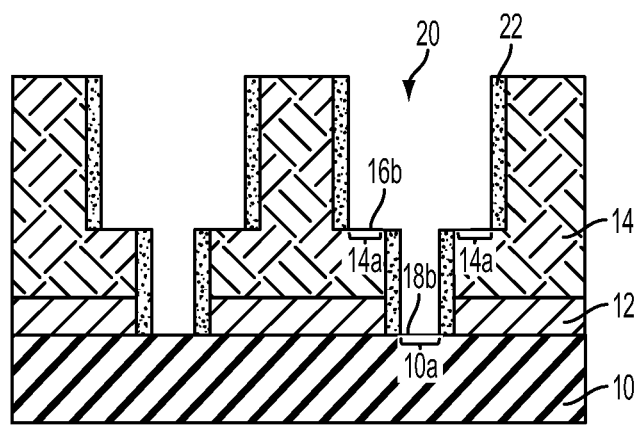

Next, as shown in FIG. 3, using an etching process, portions of the first barrier layer 22 are removed. In detail, a portion of the first barrier layer 22 is removed from the top of the IMD layer 14, a portion of the first barrier layer 22 formed on the bottom portion 16b of the trench section 16 is removed from the IMD layer 14, and a portion of the first barrier layer 22 formed on the bottom portion 18b of the via-hole section 18 is removed from the substrate 10 as well. Thus, the portion 14a of the IMD layer 14 adjacent the bottom portion 16b is exposed, and the portion 10a of the substrate 10 adjacent the bottom portion 18b is exposed as well.

Figure 4:
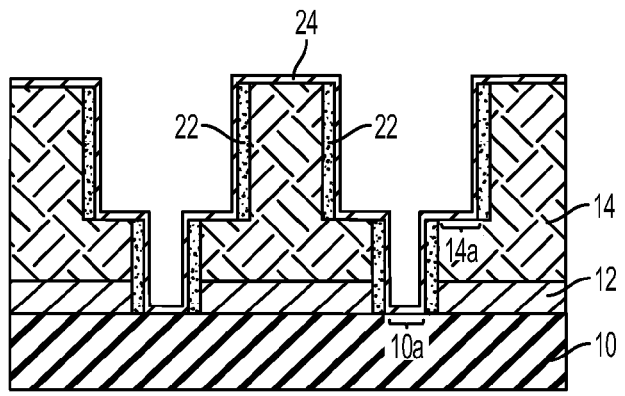

Referring to FIG. 4, a Cu alloy layer 24 is deposited to line the substrate 10. The Cu alloy layer 24 is formed on the IMD layer 14, the first barrier layer 22, the exposed portion 14a of the IMD layer 24, and the exposed portion 10a of the substrate 10. In an embodiment, the Cu alloy layer 24 is a copper-manganese (CuMn) layer. The ratio of manganese (Mn) to copper contained in the CuMn layer is not limited. In other embodiments, Ti, Al, Nb, Cr, V, Y, Tc, Re, or the like can be utilized as an additive metal for forming the Cu alloy layer 24.

Figure 5:
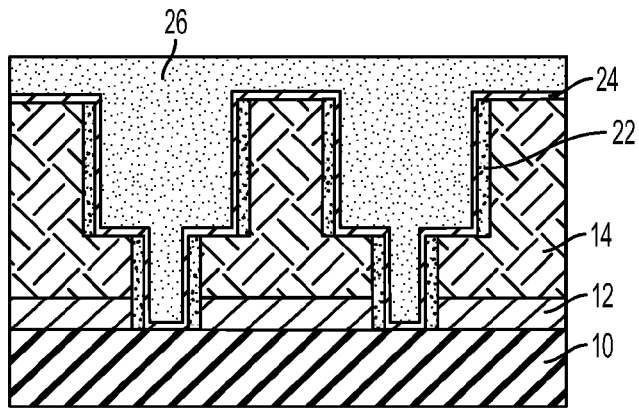

Next, in FIG. 5, for filling the dual damascene openings 20, a copper deposition process, for example electro-chemical plating (ECP) is carried out to form a copper layer 26 on the copper alloy layer 24 and fill the trench section 16 and via-hole section 18. Thus the underlying wires in the substrate 10 can be electrically connected to the copper layer 26. The copper layer 26 includes substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium.

Figure 6:
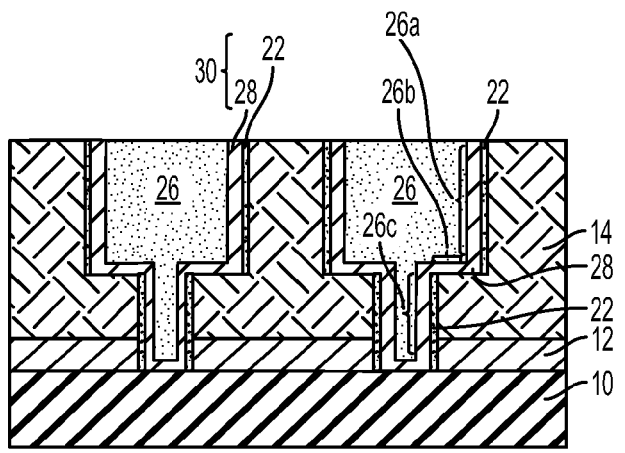

In FIG. 6, a chemical mechanical polishing (CMP) process is performed after the formation of the copper layer 26 to remove the excess portions of the copper layer 26 and the copper alloy layer 24 outside the dual damascene openings 20, thus exposing the top of the IMD layer 14 and achieving a planarized surface. In addition, after the formation of the copper layer 26, a thermal treatment, for example an annealing process, is performed on the substrate 10 at the time after the CMP process and/or before the CMP process, which causes the Cu alloy layer 24 being reacted with the first barrier layer 22 and/or the IMD layer 14. During an annealing process, the oxygen present in the first barrier layer 22 reacts with the Cu alloy layer 24 to form a metal oxide layer 28 as a second barrier layer 28 in a self-aligned manner at the boundary between the copper layer 26 and the first barrier layer 22. The formation of the metal oxide layer 28 may extend to the boundary between the copper layer 26 and IMD layer 14. The oxygen present in the IMD layer 14 may also react with the metal in the Cu alloy layer 24 to form the metal oxide layer 28 as a second barrier layer in a self-aligned manner at the boundary between the copper layer 26 and the IMD layer 14. The Cu alloy layer 24 on the bottom portion 18b of via-hole section 18 may remain as part of the copper layer 26 or be consumed in the annealing process. The formation of the metal oxide layer 28 may consume some of the first barrier layer 22 on the sidewall portions 16s and 18s. In an embodiment, the metal oxide layer 28 is a manganese oxide $(MnO)_x$ layer because the oxygen present in the oxygen-containing dielectric layer 22 reacts with the manganese (Mn) in the CuMn layer 24 during the annealing process.

In the copper interconnect structure shown in FIG. 6, the copper layer 26 is formed as a copper interconnect structure in the dual damascene opening 20 patterned in the IMD layer 14. The copper interconnect structure includes a first portion 26a adjacent the sidewall portion 16s of the upper trench section 16, a second portion 26b adjacent the bottom portion 16b of the upper trench section 16, and a third portion 26c adjacent the sidewall portion 18s of the lower via-hole section 18. A barrier structure 30 formed between the copper layer 26 and the IMD layer 14 includes the first barrier layer 22 and the second barrier layer 28. The first barrier layer 22 is an oxygen-containing dielectric layer 22 formed on the IMD layer 14 adjacent the sidewall portions 16s and 18s of the trench section 16 and the via-hole section 18. The second barrier layer 28 is a metal oxide layer 28 formed at the boundary between the first portion 26a of the copper layer 26 and the first barrier layer 22, and at the boundary between the third portion 26c of the copper layer 26 and the first barrier layer 22. The second barrier layer 28 is also formed at the boundary between the second portion 26b of the copper layer 26 and the IMD layer 14. Either the metal oxide layer 28 complements the barrier capabilities of the first barrier layer 22, or the metal oxide layer 28 itself exerts barrier capabilities. The barrier structure 30 can lower resistance and prevent copper diffusion in the metal oxide layer 28 to enhance BEOL performance. Thus, the barrier capabilities of the copper layer 26 in relation to the IMD layer 14 are improved. The first oxygen-containing dielectric layer 22 can improve the adhesion between the dielectric layer 14 and the metal oxide layer 28, and thus the metal peeling issue during the CMP process can be suppressed. Further, the metal oxide layer 28 formed in a self-aligned manner can prevent openings from forming in the dielectric liner adjacent the bottom of the via-hole section, thus solving the contact issue. These can improve package capabilities.

Cross-sectional diagrams of FIG. 7 to FIG. 11 illustrate an exemplary embodiment of a copper interconnect process, while explanation of the same or similar portions to the description in FIG. 1 to FIG. 6 will be omitted.

Figure 7:
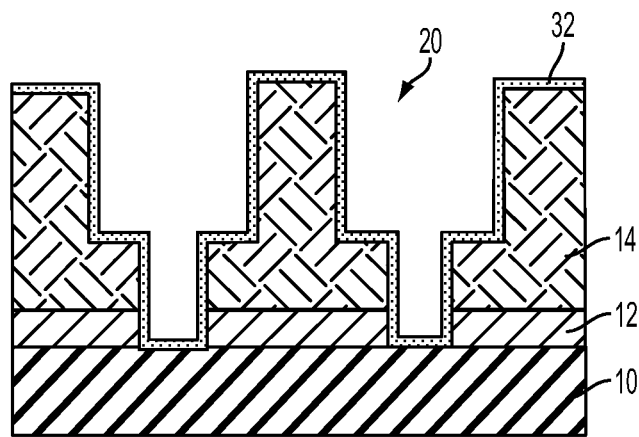
FIG. 7 to FIG. 11 are cross-sectional diagrams illustrating another exemplary embodiment of a copper interconnect process.

With reference now to FIG. 7, a third barrier layer 32 is deposited on the substrate 10 to cover the IMD layer 14 and line the sidewall portions and bottom portions of the dual damascene opening 20. In an embodiment, the third barrier layer 32 is an oxygen-free dielectric layer. The oxygen-free dielectric layer may include silicon nitride (SiN), silicon carbide (SiC), silicon carbonitride (SiCN) or the like, which may be deposited by using e.g., chemical vapor deposition (CVD), plasma enhanced CVD (PECVD), low pressure CVD (LPCVD), or other deposition techniques.

Figure 8:
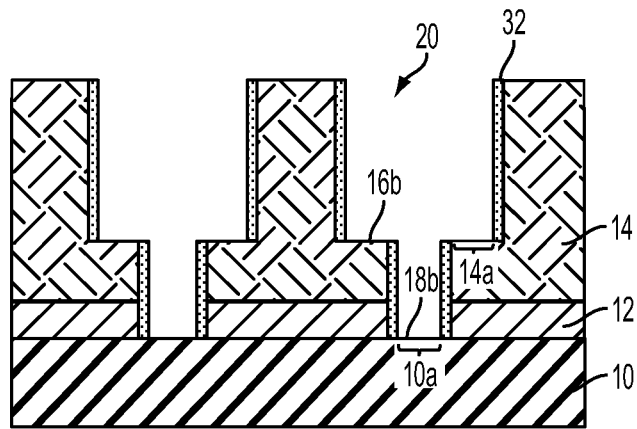

Next, as shown in FIG. 8, using an etching process, portions of the third barrier layer 32 are removed. In detail, a portion of the third barrier layer 32 is removed from the top of the IMD layer 14, a portion of third barrier layer 32 formed on the bottom portion 16b of the trench section 16 is removed to expose a portion 14a of the IMD layer 14, and a portion of the third barrier layer 32 formed on the bottom portion 18b of the via-hole section 18 is removed to expose a portion 10a of the substrate 10 as well.

Figure 9:
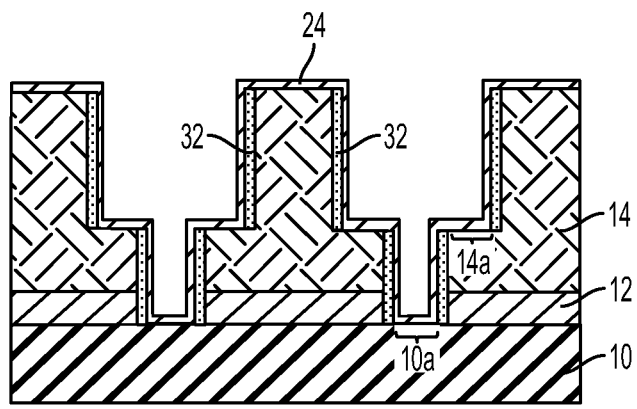

Referring to FIG. 9, a Cu alloy layer 24 is deposited to line the substrate 10. The Cu alloy layer 24 is formed on the IMD layer 14, on the third barrier layer 32, the exposed portion 14a of the IMD layer 14 and the exposed portion 10a of the substrate 10. In an embodiment, the Cu alloy layer 24 is a copper-manganese (CuMn) layer. The ratio of manganese (Mn) to copper contained in the CuMn layer is not limited. In other embodiments, Ti, Al, Nb, Cr, V, Y, Tc, Re, or the like can be utilized as an additive metal for forming the Cu alloy layer 24.

Figure 10:
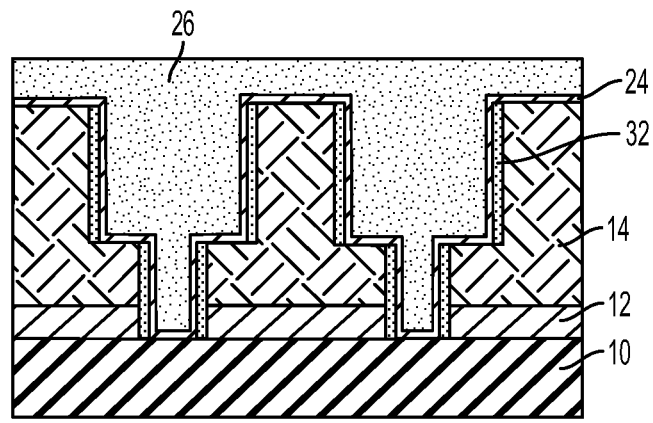

Next, in FIG. 10, for filling the dual damascene openings 20, a copper deposition process, for example electro-chemical plating (ECP) is carried out to form a copper layer 26 on the copper alloy layer 24 and fill the trench section 16 and via-hole section 18.

Figure 11:
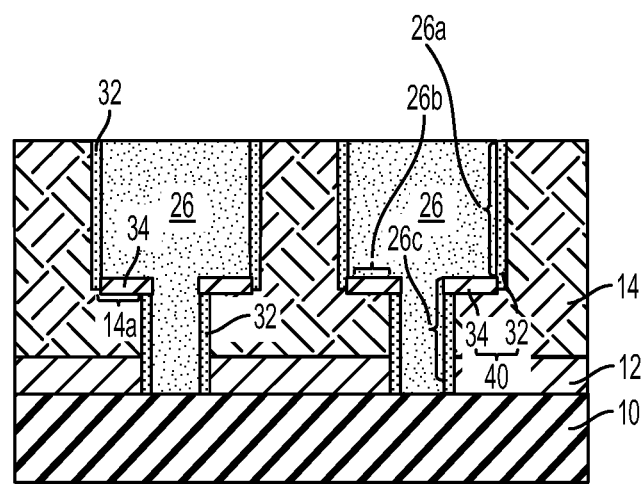

In FIG. 11, a chemical mechanical polishing (CMP) process is performed after the formation of the copper layer 26 to remove the excess portions of the copper layer 26 and the copper alloy layer 24 outside the dual damascene openings 20, thus exposing the top of the IMD layer 14 and achieving a planarized surface. In addition, after the formation of the copper layer 26, a thermal treatment, for example an annealing process, is performed on the substrate 10 at the time after the CMP process and/or before the CMP process, which causes the Cu alloy layer 24 being reacted with the exposed portion 14a of the IMD layer 14. During an annealing process, the oxygen present in the IMD layer 14 reacts with the Cu alloy layer 24 to form a metal oxide layer 34 as a fourth barrier layer 34 in a self-aligned manner at the boundary between the copper layer 26 and the third barrier layer 32. Because the Cu alloy layer 24 does not react with the oxygen-free dielectric 32, the third barrier layer 32 remains on the sidewall portions 16s and 18s of the trench section 16 and the via-hole section 18, and the copper alloy layer 24 adjacent the sidewall portions 16s and 18s may remain as part of the copper layer 26 or is consumed in the annealing process. In an embodiment, the metal oxide layer 34 is a manganese oxide $(MnO_x)$ layer because the oxygen present in the IMD layer 14 reacts with the manganese (Mn) in the CuMn layer 24 during the annealing process.

In the copper interconnect structure shown in FIG. 11, the copper layer 26 is formed as a copper interconnect structure in the dual damascene opening 20 patterned in the IMD layer 14. The copper interconnect structure includes a first portion 26a adjacent the sidewall portion 16s of the upper trench section 16, a second portion 26b adjacent the bottom portion 16b of the upper trench section 16, and a third portion 26c adjacent the sidewall portion 18s of the lower via-hole section 18. A barrier structure 40 formed between the copper layer 26 and the IMD layer 14 includes the first barrier layer 32 and the second barrier layer 34. The first barrier layer 32 is an oxygen-free dielectric layer formed on the IMD layer 14 adjacent the sidewall portions 16s and 18s of the trench section 16 and the via-hole section 18. The second barrier layer 34 is a metal oxide layer 34 formed at the boundary between the second portion 26b of the copper layer 26 and the IMD layer 14. Either the metal oxide layer 34 complements the barrier capabilities of the first barrier layer 32, or the metal oxide layer 34 exerts barrier capabilities. The barrier structure 40 can lower resistance and prevent copper diffusion in the metal oxide layer 34 to enhance BEOL performance. Thus, the barrier capabilities of the copper layer 26 in relation to the IMD layer 14 are improved. The barrier structure 40 can improve the adhesion between the copper layer 26 and the dielectric layer 14, and thus the metal peeling issue during the CMP process can be suppressed. These can improve package capabilities.

Although the present disclosure has been described in its preferred embodiments, it is not intended to limit the description to the precise embodiments disclosed herein. Those skilled in this technology can still make various alterations and modifications without departing from the scope and spirit of this disclosure.

What is claimed is:

1. A semiconductor device, comprising:
   a semiconductor substrate;
   a dielectric layer overlying the semiconductor substrate;
   a copper-containing layer formed in the dielectric layer, wherein the copper-containing layer has a first portion and a second portion;
   a first barrier layer formed between the first portion of the copper-containing layer and the dielectric layer; and
   a second barrier layer formed at a boundary between the second portion of the copper-containing layer and the dielectric layer wherein the second barrier layer is adjacent to an exposed portion of the dielectric layer;
   wherein, the first barrier layer is a dielectric layer, and the second barrier layer is a metal oxide layer, and a boundary between a sidewall of the copper-containing layer and the first barrier layer is free of the second barrier layer.

2. The semiconductor device of claim 1, wherein the second barrier layer is a metal oxide layer comprising manganese (Mn).

3. The semiconductor device of claim 1, wherein the copper-containing layer is formed in a dual damascene opening formed in the dielectric layer, and the dual damascene opening comprises an upper trench section and a lower via-hole section.

4. The semiconductor device of claim 3, wherein the first portion of the copper-containing layer is adjacent a sidewall portion of the upper trench section.

5. The semiconductor device of claim 3, wherein the second portion of the copper-containing layer is adjacent a bottom portion of the upper trench section.

6. The semiconductor device of claim 3, wherein the first portion of the copper-containing layer is adjacent a sidewall portion of the lower via-hole section.

7. The semiconductor device of claim 3, wherein a boundary between the copper-containing layer and a sidewall portion of the upper trench section is free of the second barrier layer, and a boundary between the copper-containing layer and a sidewall portion of the lower via-hole section is free of the second barrier layer.

8. The semiconductor device of claim 1, wherein the dielectric layer comprises a dielectric material layer with a dielectric constant less than 2.5.

9. The semiconductor device of claim 1, further comprising an etch stop layer formed between the semiconductor substrate and the dielectric layer.

10. The semiconductor device of claim 1, wherein the first barrier layer comprises an oxygen-free material.

11. The semiconductor device of claim 1, wherein the first barrier layer comprises at least one of SiN, SiC, or SiCN.

12. A semiconductor device, comprising:
    a semiconductor substrate;
    a dielectric layer overlying the semiconductor substrate, wherein an opening comprises an upper trench section and a lower via-hole section and is formed in the dielectric layer, the upper trench section comprises a first sidewall portion and a bottom portion, and the lower via-hole section comprises a second sidewall portion;
    a copper-containing layer filling the opening formed in the dielectric layer, wherein the copper-containing layer comprises a first portion adjacent the first sidewall portion, a second portion adjacent the bottom portion, and a third portion adjacent the second sidewall portion;
    a dielectric barrier layer formed between the first portion of the copper-containing layer and the dielectric layer, and formed between the third portion of the copper-containing layer and the dielectric layer; and
    a metal oxide layer formed at a boundary between the second portion of the copper-containing layer and the dielectric layer, wherein the metal oxide layer is adjacent to an exposed portion of the dielectric layer,
    wherein a boundary between the first portion of the copper-containing layer and the dielectric barrier layer is free of the metal oxide layer,
    wherein the metal oxide layer overlays the dielectric barrier layer formed between the third portion of the copper-containing layer and the dielectric layer.

13. The semiconductor device of claim 12, wherein the metal oxide layer comprises manganese (Mn).

14. The semiconductor device of claim 12, wherein the dielectric barrier layer comprises an oxygen-free material.

15. The semiconductor device of claim 12, wherein the dielectric barrier layer comprises at least one of SiN, SiC, or SiCN.

16. The semiconductor device of claim 12, wherein a boundary between the third portion of the copper-containing layer and the dielectric barrier layer is free of the metal oxide layer.

17. A semiconductor device, comprising:
    a semiconductor substrate;
    a dielectric layer overlying the semiconductor substrate, wherein an opening comprises an upper trench section and a lower via-hole section in the dielectric layer, the upper trench section comprises a first sidewall portion and a bottom portion, and the lower via-hole section comprises a second sidewall portion;
    a copper-containing layer in the opening formed in the dielectric layer, wherein the copper-containing layer comprises a first portion adjacent the first sidewall portion, a second portion adjacent the bottom portion, and a third portion adjacent the second sidewall portion;
    a first barrier layer between the first portion of the copper-containing layer and the dielectric layer, and between the third portion of the copper-containing layer and the dielectric layer; and
    a second barrier layer at a boundary between the second portion of the copper-containing layer and the dielectric layer, wherein the second barrier layer is adjacent to an exposed portion of the dielectric layer,
    wherein a boundary between the first portion of the copper-containing layer and the first barrier layer is free of the second barrier layer, and a boundary between the third portion of the copper-containing layer and the first barrier layer is free of the second barrier layer,
    wherein the first barrier layer between the first portion of the copper-containing layer and the dielectric layer is between a sidewall of the second barrier layer and the dielectric layer.

18. The semiconductor device of claim 17, wherein the first barrier layer comprises an oxygen-free material.

19. The semiconductor device of claim 17, wherein the first barrier layer comprises at least one of SiN, SiC, or SiCN.

20. The semiconductor device of claim 17, wherein a sidewall of the second barrier layer is separated from the first sidewall portion by the first barrier layer.

* * * * *